(12) United States Patent
Kim

(10) Patent No.: US 10,153,322 B2
(45) Date of Patent: Dec. 11, 2018

(54) ORGANIC LIGHT EMITTING DISPLAY DEVICE

(71) Applicant: LG Display Co., Ltd., Seoul (KR)

(72) Inventor: Do-Young Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/662,668

(22) Filed: Jul. 28, 2017

(65) Prior Publication Data

US 2018/0033821 A1    Feb. 1, 2018

Related U.S. Application Data

(60) Provisional application No. 62/368,293, filed on Jul. 29, 2016.

(51) Int. Cl.
| | | |
|---|---|---|
| *H01L 27/146* | (2006.01) | |
| *H01L 27/32* | (2006.01) | |
| *H01L 51/52* | (2006.01) | |
| *H05B 33/22* | (2006.01) | |
| *H01L 27/12* | (2006.01) | |

(52) U.S. Cl.
CPC .... *H01L 27/14692* (2013.01); *H01L 27/3225* (2013.01); *H01L 51/5253* (2013.01); *H01L 27/124* (2013.01); *H05B 33/22* (2013.01)

(58) Field of Classification Search
CPC ......... H01L 2251/5338; H01L 27/3225; H01L 27/124; H01L 51/5253; H01L 27/3288; H01L 27/3262; H01L 27/14692; H01L 51/5293; H05B 33/22

See application file for complete search history.

(56) References Cited

U.S. PATENT DOCUMENTS

| 9,276,055 | B1 * | 3/2016 | Son | H01L 27/3276 |
|---|---|---|---|---|
| 9,287,329 | B1 * | 3/2016 | Lee | H01L 51/0097 |
| 9,356,087 | B1 * | 5/2016 | Lee | H01L 27/3276 |
| 9,544,994 | B2 * | 1/2017 | Kwon | H05K 1/028 |
| 9,881,982 | B2 * | 1/2018 | Kang | H01L 27/3262 |

* cited by examiner

*Primary Examiner* — Jasmine Clark
(74) *Attorney, Agent, or Firm* — Morgan, Lewis & Bockius LLP

(57) ABSTRACT

An organic light emitting display device includes a substrate in which an active area and a bending area are defined, a thin film transistor on the substrate in the active area, a first wiring line on the substrate in the bending area, a first planarization layer which is on the thin film transistor in the active area and on the first wiring line in the bending area, a second wiring line on the first planarization layer in the bending area, a second planarization layer which is on the first planarization layer in the active area and on the first planarization layer and the second wiring line in the bending area, an organic light emitting element on the second planarization layer in the active area, and a micro-cover layer on the second planarization layer in the bending area.

16 Claims, 12 Drawing Sheets

ORGANIC LIGHT EMITTING DISPLAY DEVICE

CROSS-REFERENCE TO RELATED APPLICATIONS

This application claims the priority of U.S. Provisional Patent Application No. 62/368,293 filed on Jul. 29, 2016 the disclosure of which is incorporated herein by reference.

BACKGROUND

Technical Field

The present disclosure relates to an organic light emitting display device, and more particularly to an organic light emitting display device which may reduce stress caused in bent wiring lines and an inorganic layer.

Description of the Related Art

Recently, the display devices that visually expresses electrical information signals have been rapidly developed. Correspondingly, various display devices have been developed with excellent performance in terms of thinness, light weight, and low power consumption, and are rapidly replacing existing cathode ray tube CRTs.

Specific examples of the display devices include a liquid crystal display device LCD, an organic light emitting display device (OLED), an electrophoretic display device (EPD), a plasma display device (PDP), an electro-wetting display device (EWD). Specifically, the organic light emitting display device is a next-generation display device having a self-emission property and has an excellent characteristics in terms of viewing angle, contrast ratio, response speed, and power consumption as compared with the liquid crystal display device.

Further, in recent years, a display device in which a display unit and wiring lines are formed on a flexible substrate such as plastic which is a flexible material so that an image can be displayed even though the substrate is bent like a paper is attracting attention as a next generation display device.

As described above, when the organic light emitting display device is manufactured using a flexible substrate such as plastic, it is necessary to secure proper flexibility of a substrate, even though various insulating layers and wiring lines formed of a metal material are formed on the substrate.

In the case of wiring lines, when the substrate on which the wiring lines are formed is bent, the wiring lines may be damaged or cracked due to physical stress caused by the bending. When the wiring line is cracked, the signals may not be normally transferred such that thin film transistors or organic light emitting elements is operate abnormally, which results in malfunction of the light emitting display device.

In the case of the insulating layer, an inorganic film or an organic film which configures the insulating layer has inherent brittleness, so that the flexibility of the insulating layer is lower than that of the wiring line which is formed of metal. Therefore, when the substrate on which the insulating layer is formed is bent, the insulating layer may also be damaged or cracked due to the stress caused by the bending.

When a partial area of the insulating layer is damaged, cracks may propagate or extend into other areas of the insulating layer and also to the wiring lines which are in contact with the insulating layer, which results in malfunction of the organic light emitting display device.

SUMMARY

Therefore, inventors of the present disclosure invented an organic light emitting display device with a new structure to reduce the damage or crack generated in various insulating layers and wiring lines in a bent area of the organic light emitting display device. The inventors of the present disclosure further recognized that as the resolution of the organic light emitting display device increases as a result of technical advancements, the space or footprint area where a greater number of wiring lines or capacitors need to be disposed may be insufficient. However, when a bezel area is increased to accommodate the wiring lines or capacitors, there may be difficulty to implement a narrow bezel configuration for the display device. Therefore, the inventors of the present disclosure invented an organic light emitting display device with a new structure in which the wiring lines or capacitors are freely disposed in a restricted space.

Accordingly, embodiments of the present disclosure are directed to an organic light emitting display device that substantially obviates one or more of the problems due to limitations and disadvantages of the related art.

An aspect of the present disclosure is to provide an organic light emitting display device which reduces stress applied to the wiring lines and the insulating layers formed in a bending area by adjusting the insulating layers disposed in the bending area.

Another aspect of the present disclosure is to provide an organic light emitting display device which uses a plurality of planarization layers to maximize a space where a metal material layer is disposed.

Aspects of the present disclosure are not limited to the above-mentioned, and other aspects, which are not mentioned above, can be clearly understood by those skilled in the art from the following descriptions.

According to an aspect of the present disclosure, an organic light emitting display device includes a substrate in which an active area and a bending area are defined, a thin film transistor disposed on the substrate in the active area, a first wiring line disposed on the substrate in the bending area, a first planarization layer which is disposed on the thin film transistor in the active area and disposed on the first wiring line in the bending area, a second wiring line disposed on the first planarization layer in the bending area, a second planarization layer which is disposed on the first planarization layer in the active area and disposed on the first planarization layer and the second wiring line in the bending area, an organic light emitting element disposed on the second planarization layer in the active area, and a micro cover layer disposed on the second planarization layer in the bending area.

Other detailed matters of the embodiments are included in the detailed description and the drawings.

According to the present disclosure, various insulating layers such as a plurality of planarization layers, a bank, a spacer, a micro-cover layer (MCL) are disposed in a bending area, thereby reducing a stress which is applied to the various wiring lines and inorganic layers disposed in the bending area.

Further, according to the present disclosure, a plurality of planarization layers is used, thereby reducing a space where a metal material layer such as a wiring line or a capacitor is disposed.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
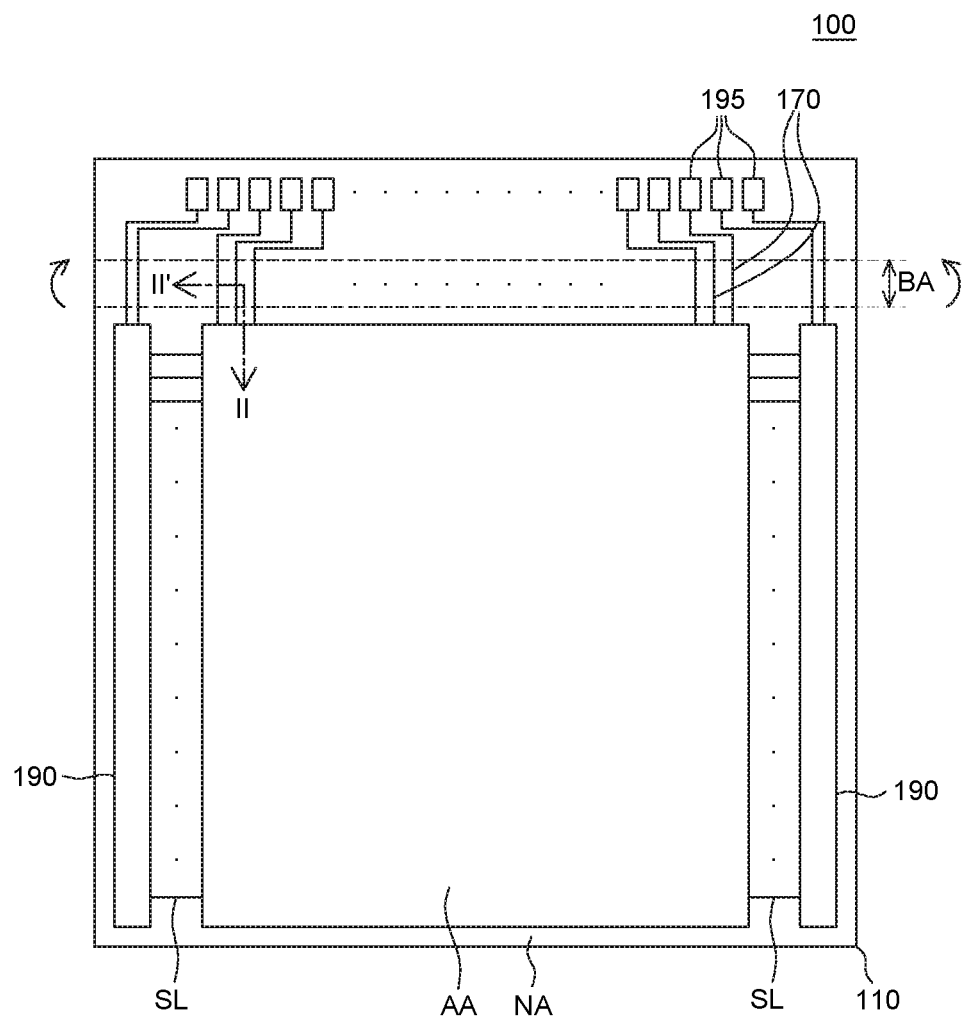
FIG. 1 is a schematic plan view illustrating an organic light emitting display device according to an embodiment of the present disclosure.

Advantages and characteristics of the present disclosure and a method of achieving such will be clearly understood by referring to the embodiments described below in detail together with the accompanying drawings. However, the present disclosure is not limited to the embodiments disclosed herein but may also be implemented in various forms. The embodiments are provided by way of example only so that a person of ordinary skilled in the art can fully understand the technical aspects of the present disclosure and the scope thereof, which can be defined the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description, a detailed explanation of certain known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated. When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical spirit of the present disclosure. Like reference numerals generally denote like elements throughout the specification. A size and a thickness of each component illustrated in the drawing are illustrated for convenience of description, and the present disclosure is not limited to the size and the thickness of the components as illustrated.

The features of various embodiments of the present disclosure can be partially or entirely bonded to or combined with each other and can be interlocked and operated in technically various ways as understood by those skilled in the art, and the embodiments can be carried out independently of or in association with each other. Hereinafter, various embodiments of the present disclosure will be described in detail with reference to accompanying drawings.

FIG. 1 is a schematic plan view for explaining an organic light emitting display device according to an embodiment of the present disclosure.

A substrate 110 includes an active area AA and a non-active area NA which encloses the active area AA. The active area AA is an area where an image is displayed in the organic light emitting display device 100. In the active area AA, an organic light emitting element 180 and various driving elements for driving the organic light emitting element 180, which will be described below, may be disposed. The non-active area NA is an area where the image is not displayed in the organic light emitting display device 100. In the non-active area, various signal lines such as a scan line SL, wiring lines 170, and a circuit unit such as a gate driving unit 190 are formed. The gate driving unit 190 may be disposed in the form of a GIP as illustrated in FIG. 1.

A pad 195 is disposed in the non-active area NA. The pad 195 may be disposed on one side of the substrate 110 in the non-active area NA. The pad 195 is a metal pattern to which an external module such as a flexible printed circuit board (FPCB) or a chip on film (COF) is bonded.

The wiring line 170 is disposed in the non-active area NA. The wiring line 170 transfers a signal (voltage) from the external module which is bonded to the pad 195 to the active area AA or a circuit unit such as a gate driving unit 190. For example, various signals, which drive the gate driving unit 190, such as a data signal, a high potential voltage VDD, or a low potential voltage VSS may be transferred through the wiring line 170. The wiring line 170 may be formed simultaneously with the same material as various conductive elements disposed in the active area AA.

A bending area BA is defined in the non-active area NA which is adjacent to the active area AA. The bending area BA can accommodate the pad 195 and an external module bonded to the pad 195 on a rear surface of the substrate 110. That is, as the bending area BA is bent (an arrow direction of FIG. 1), the external module bonded to the pad 195 of the substrate 110 moves toward the rear surface of the substrate 110 so that the external module may not be visible when viewed from an upper portion of the substrate 110. Further, as the bending area BA is bent, a size of the non-active area NA which is visible from the upper portion of the substrate 110 is reduced, so that a narrow bezel may be implemented.

Hereinafter, components of the organic light emitting display device 100 will be described in more detail with reference to FIGS. 2A and 2B.

Figure 2A:
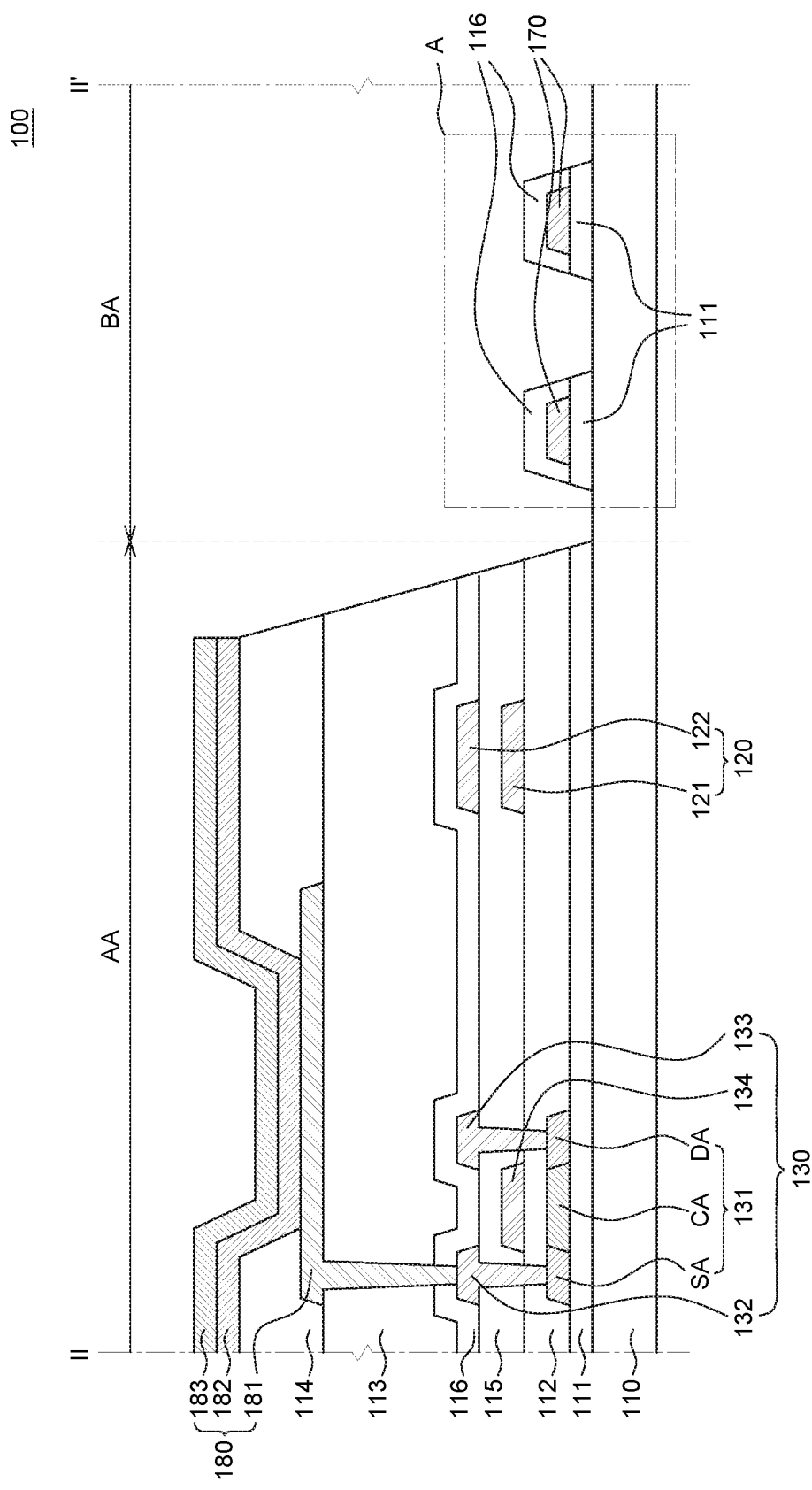
FIG. 2A is a cross-sectional view of an organic light emitting display taken along the line II-II' of FIG. 1.

FIG. 2A is a cross-sectional view of an organic light emitting display taken along the line II-II' of FIG. 1.

The organic light emitting display device 100 according to an embodiment of the present disclosure illustrated in FIG. 2A is a top emission type organic light emitting display device.

The substrate 110 supports various components of the organic light emitting display device 100. The substrate 110 may be formed of a plastic material having flexibility, and for example, polyimide PI. When the substrate 110 is formed of polyimide PI, a manufacturing process is performed by using a supporting substrate formed of glass disposed below the substrate 110 and then the supporting substrate may be released (or removed) after completing the manufacturing process. Further, after releasing the supporting substrate, a back plate (or similar structure) for supporting the substrate may be disposed below the substrate 110.

Then a buffer layer 111 may be formed on the substrate 110. The buffer layer 111 may be formed of a single layer of silicon nitride SiNx or silicon oxide SiOx, which is an inorganic material, or a multiple layer of silicon nitride SiNx and silicon oxide SiOx. The buffer layer 111 improves adhesiveness between layers formed on the buffer layer 111 and the substrate 110 and blocks alkali components leaked from the substrate 110. However, the buffer layer 111 may be omitted based on a type and a material of the substrate 110 and a structure and a type of a thin film transistor 130.

The thin film transistor 130 is disposed on the buffer layer 111. The thin film transistor 130 includes an active layer 131 formed of film transistor 130 may include an active layer 131 formed of polysilicon, a gate electrode 134, a source electrode 132, and a drain electrode 133. The thin film transistor 130 of FIG. 2A is a driving thin film transistor and is a thin film transistor having a top gate structure in which the gate electrode 134 is disposed on the active layer 131. For the convenience of description, in FIG. 2A, only a driving thin film transistor is illustrated among various thin film transistors which may be included in the organic light emitting display device 100. However, other thin film transistor such as a switching thin film transistor may also be included in the organic light emitting display device 100. Further, even though in the present disclosure, it is described that the thin film transistor 130 has a coplanar structure, a thin film transistor 130 having other structures, such as a staggered structure may also be implemented.

The active layer 131 of the thin film transistor 130 is disposed on the buffer layer 111. The active layer 131 includes a channel area CA in which a channel is formed when the thin film transistor 130 is driven and a source area SA and a drain area DA on both sides of the channel area CA. The channel area CA, the source area SA, and the drain area DA are defined by ion doping (i.e. impurity doping).

The active layer 131 of the thin film transistor 130 may be formed of polysilicon. Such polysilicon is formed by depositing an amorphous silicon (a-Si) material on the buffer layer 111 and performing a dehydrogenation process, a crystallization process, an activation process, and a hydrogenation process. The active layer 131 is formed by patterning the polysilicon. When the active layer 131 is formed of polysilicon, the thin film transistor 131 may be an LTPS thin film transistor 130 using low temperature polysilicon (LTPS). The polysilicon material has a high mobility so that when the active layer 131 is formed of polysilicon, there is an advantage in that energy power consumption is low and reliability is high.

Alternatively, the active layer 131 of the thin film transistor 130 may be formed of an oxide semiconductor material. The active layer 131 of the thin film transistor 130 may be formed of metal oxide, for example, formed of metal oxide such as IGZO, but is not limited thereto. Since the oxide semiconductor material has a larger band gap than that of silicon material, electrons do not go beyond the band gap in an off state, and thus an off-current is advantageously low.

The gate insulating layer 112 is disposed on the active layer 131 and the buffer layer 111. The gate insulating layer 112 may be formed of a single layer of silicon nitride SiNx or silicon oxide SiOx which is an inorganic material or a multiple layer of silicon nitride SiNx and silicon oxide SiOx. Contact holes through which the source electrode 132 and the drain electrode 133 are in contact with the source area SA and the drain area DA of the active layer 131, respectively, are formed in the gate insulating layer 112. Even though in FIG. 2A, it is illustrated that the gate insulating layer 112 is planarized (i.e. substantially flat), the gate insulating layer 112 may be formed depending on shapes of components disposed at a lower portion.

The gate electrode 134 is disposed on the gate insulating layer 112. The gate electrode 134 is formed by forming a metal layer such as molybdenum (Mo) on the gate insulating layer 112 and patterning the metal layer. The gate electrode 134 is disposed on the gate insulating layer 112 to overlap the channel area CA of the active layer 131.

An interlayer insulating layer 115 is formed on the gate electrode 134. The interlayer insulating layer 115 may be formed of a single layer of silicon nitride SiNx or silicon oxide SiOx which is an inorganic material or multiple layers of silicon nitride SiNx and silicon oxide SiOx. Contact holes through which the source electrode 132 and the drain electrode 133 are in contact with the source area SA and the drain area DA of the active layer 131, respectively, are formed in the interlayer insulating layer 115. Even though, in FIG. 2A, it is illustrated that the interlayer insulating layer 115 is planarized, the interlayer insulating layer 115 may be formed depending on shapes of components disposed therebelow.

The source electrode 132 and the drain electrode 133 are disposed on the interlayer insulating layer 115. The source electrode 132 and the drain electrode 133 may be formed of conductive metal materials, and for example, may have a triple layered structure of titanium (Ti)/aluminum (Al)/titanium (Ti). The source electrode 132 and the drain electrode 133 are connected to the source area SA and the drain area DA of the active layer 131 through contact holes, respectively.

A storage capacitor 120 is disposed on the substrate 110. The storage capacitor 120 includes a first electrode 121 disposed on the gate insulating layer 112 and a second electrode 122 disposed on the interlayer insulating layer 115. The first electrode 121 of the storage capacitor 120 may be formed simultaneously with the same material as the gate electrode 134 of the thin film transistor 130 and the second electrode 122 of the storage capacitor 120 may be formed simultaneously with the same material as the source electrode 132 and the drain electrode 133 of the thin film transistor 130. Therefore, since the storage capacitor 120 may be formed during the manufacturing process of the thin film transistor 130 without using a separate additional process, there is efficiency in terms of processing cost and processing time.

A passivation layer 116 may be disposed on the thin film transistor 130 and the storage capacitor 120. The passivation layer 116 is an insulating layer for protecting the thin film transistor 130 and the storage capacitor 120. The passivation layer 116 may be formed of a single layer of silicon nitride SiNx or silicon oxide SiOx which is an inorganic material or a multiple layer of silicon nitride SiNx and silicon oxide SiOx. The passivation layer 116 includes a contact hole through which the anode 181 of the organic light emitting element 180 is electrically connected to the thin film transistor 130. However, the passivation layer 116 may be omitted depending on a design of the organic light emitting display device 100.

The planarization layer 113 is disposed on the passivation layer 116. The planarization layer 113 is an insulating layer for planarizing an upper portion of the thin film transistor 130 and is formed of an organic material. As illustrated in FIG. 2A, the passivation layer 116 is formed along the shape of the upper portions of the thin film transistor 130 and the storage capacitor 120. Therefore, the passivation layer 116 may not be planarized due to the thin film transistor 130 and the storage capacitor 120 and may have a step (or uneven) portion. Accordingly, the upper portions of the thin film transistor 130 and the storage capacitor 120 are planarized so that the organic light emitting element 180 may be more reliably formed. In the planarization layer 113, a contact hole through which the source electrode 132 of the thin film transistor 130 is exposed is formed.

The organic light emitting element 180 is disposed on the planarization layer 113. The organic light emitting element 180 includes an anode 181 electrically connected to the source electrode 132 of the thin film transistor 130, an organic layer 182 disposed on the anode 181, and a cathode 183 formed on the organic layer 182. Since the organic light emitting display device 100 is a top emission type organic light emitting display device, the anode 181 may include a reflective layer which reflects light emitted from the organic layer 182 toward the cathode 183 and a transparent conductive layer which supplies holes to the organic layer 182. However, the anode 181 may include only the transparent conductive layer and the reflective layer may be defined as a separate component from the anode 181. The organic layer 182 emits light with a specific color and includes one of a red organic light emitting layer, a green organic light emitting layer, a blue organic light emitting layer, and a white organic light emitting layer. When the organic layer 182 includes the white organic light emitting layer, a color filter which converts white light from the white organic light emitting layer to light with other colors may be disposed above the organic light emitting element 180. Further, the organic layer 182 may further include various organic layers such as a hole transport layer, a hole injection layer, an electron injection layer, and an electron transport layer, in addition to the organic light emitting layer. The cathode 183 may be formed of a transparent conductive material and for example, may be formed to include a transparent conductive oxide such as IZO or ytterbium (Yb).

A bank 114 is disposed on the anode 181 and the planarization layer 113. The bank 114 defines a pixel area by dividing adjacent pixel areas in the active area AA. The bank 114 may be formed of an organic material. For example, the bank 114 may be formed of polyimide, acryl, or benzocyclobutene (BCB) based resin, but is not limited thereto.

An encapsulation unit which protects the organic light emitting element 180 which is vulnerable to moisture so as not to be exposed to moisture may be formed on the organic light emitting element 180. For example, the encapsulation unit may have a structure in which inorganic layers and organic layers are alternately laminated.

The wiring line 170 is disposed in the bending area BA. The wiring line 170 may be formed of the same material as the conductive elements disposed in the active area AA. For example, as illustrated in FIG. 2A, even though the wiring line 170 may be formed of the same material as the source electrode 132 and the drain electrode 133, the material is not limited thereto. The wiring line 170 may be formed of the same material as the gate electrode 134.

The wiring line 170 may be enclosed by an insulating material that provides protection thereof. Specifically, the wiring line 170 may be enclosed by an inorganic film. For example, as illustrated in FIG. 2A, the buffer layer 111 which is formed of an inorganic material is formed below the wiring line 170 and a passivation layer 116 which is formed of an inorganic material may be formed to enclose an upper portion and a side portion of the wiring line 170. Therefore, a phenomenon in that the wiring line 170 reacts with moisture to be corroded may be suppressed.

As described above, when the organic light emitting display device 100 includes a single planarization layer, a wiring line 170 having a single layer structure is formed in the bending area BA. That is, in the bending area BA, the wiring line 170 may not be formed to have a double layered structure, but the wiring line 170 is formed to have a single layer structure as illustrated in FIG. 2A.

When the wiring line 170 is formed to have a single layer structure as described above, a large amount of space is required to accommodate a specific number of wiring lines 170. In order to form the wiring lines 170, after depositing a conductive material in the bending area BA, the conductive material is patterned by a process such as an etching process to have a shape of the wiring lines 170 to be formed. In this case, since the fineness of the etching process is limited, there is a limitation in narrowing the distance between the wiring lines 170. Further, since the insulating layers which enclose the wiring lines 170 need to be patterned, the distance between the wiring lines 170 is not narrowed more than a specific gap. Accordingly, since a large amount of spaces are required to form the wiring lines 170 in the bending area BA, a size of the non-active area NA is increased. Therefore, it may be difficult to implement the narrow bezel.

Further, when one wiring line 170 is used to transfer one signal, if the wiring line 170 is cracked (or broken), the signal may not be transferred. As described above, the wiring line 170 is disposed in the bending area BA, the wiring line 170 may be cracked while bending the substrate 110. Further, the inorganic material which forms the buffer layer 111 and the passivation layer 116 are more vulnerable to the stress due to the bending than the conductive material which forms the wiring line 170. Therefore, the crack which is generated in the buffer layer 111 and the passivation layer 116 enclosing the wiring line 170 due to the stress caused by the bending may be propagated to the wiring line 170. As described above, when the wiring line 170 is cracked, the signal which is transferred by the wiring line 170 may not be transferred. Further, resistance of the wiring line 170 is significantly increased so that a desired signal may not be transferred.

However, as described above, the wiring lines 170 need to be formed to have a single layer structure. Therefore, when a plurality of wiring lines 170 is used to transfer one signal, an area occupied by the wiring lines 170 in the non-active area NA is increased. For example, when two wiring lines 170 are used to transfer one signal, the area occupied by the wiring lines 170 is doubled. Therefore, when a single planarization layer 113 is used, it is very difficult to prepare for the possibility of cracks being formed in the wiring line 170.

Further, when the single planarization layer 113 is used, there is a high possibility that various signal lines, such as a scan line SL and a data line, which are disposed in the active area AA as well as the bending area BA are implemented as one layer. That is, in the active area AA, various driving elements such as the thin film transistor 130 and the storage capacitor 120 are disposed and the scan line SL which is formed of the same material as the gate electrode 134 and the data line which is formed of the same material as the source electrode 132 and the drain electrode 133 are closely disposed. Therefore, it is very difficult to secure an extra conductive layer for using the scan line SL and the data line as a double layered structure so that it is very difficult to reduce the resistance of various signal lines such as the scan line SL and the data line.

Further, in order to increase the capacitance of the storage capacitor 120, it is desirable to implement the storage capacitor 120 to have a structure in that a plurality of capacitors 120 is connected in parallel to each other. However, in order to do so, a plurality of electrodes which is disposed in an overlapping manner is required. In order to secure the plurality of electrodes, a plurality of conductive layers needs to be secured. However, as described above, various driving elements and signal lines are already closely disposed in the active area AA and the number of available conductive layers is limited. Therefore, it is very difficult to secure the extra conductive layer.

Further, according to the structure of the bending area BA as illustrated in FIG. 2A, while bending the substrate 110, tensile force is applied to the wiring lines 170 and the buffer layer 111 and the passivation layer 116 which enclose the wiring lines 170 and the tensile force is large. Therefore, there is a high possibility that the wiring line 170 and/or the buffer layer 111, and the passivation 116 are cracked.

Hereinafter, the crack of the wiring lines 170 and/or the buffer layer 111 and the passivation layer 116 will be described with reference to FIG. 3.

Figure 3:
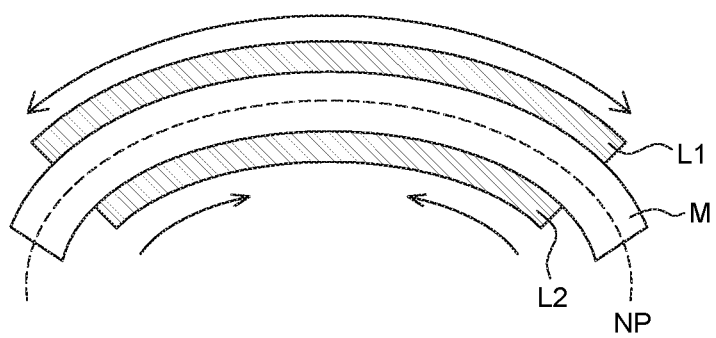
FIG. 3 is a schematic cross-sectional view for explaining compressive force and tensile force which are applied to layers disposed above and below a neutral plane when a supporting layer is bent.

FIG. 3 is a schematic cross-sectional view for explaining compressive force and tensile force which are applied to layers disposed above and below a neutral plane when a supporting layer is bent. In FIG. 3, for the convenience of description, it is assumed that a first layer L1 is disposed on an upper surface of the supporting layer M, a second layer L2 is disposed on a lower surface of the supporting layer M and the first layer L1 and the second layer L2 are formed by the same material with the same thickness. The supporting layer M illustrated in FIG. 3 may correspond to the substrate 110 and the first layer L1 and the second layer L2 may correspond to any one of the wiring line 170, the buffer layer 111, and the passivation layer 116.

The neutral plane NP refers to a virtual (or imaginary) plane on which the compressive force and the tensile force applied to the structure upon bending are cancelled with each other. Therefore, it can be said that no stress is applied to the neutral plane. As described above, it is assumed that the first layer L1 is disposed on the upper surface of the supporting layer M and the second layer L2 is disposed on the lower surface of the supporting layer M and both ends of the supporting layer M are lowered and a central portion of the supporting layer M is raised so that the supporting layer M is bent. In this case, as illustrated in FIG. 3, the first layer L1 disposed on the upper surface of the supporting layer M extends so that the tensile force is applied to the first layer L1. Further, the second layer L2 disposed on the lower surface of the supporting layer M is compressed so that the compressive force is applied to the second layer L2. Further, the neutral plane NP is disposed on the supporting layer M which is the middle of the structure in which the first layer L1, the supporting layer M, and the second layer L2 are laminated. That is, in a state in which one side of the supporting layer M is fixed, when the other side of the supporting layer M is downwardly bent, the first layer L1 located above the neutral plane NP is applied with the tensile force and the second layer L2 disposed below the neutral plane NP is applied with the compressive force. However, when a magnitude of the compressive force is equal to a magnitude of the tensile force, since the wiring 170, the buffer layer 111 and the passivation layer 116 are more vulnerable to being subjected to the tensile force, the first layer L1 is more likely to be cracked than the second layer L2 under the assumption that the distances from the neutral plane NP are equal to each other.

Therefore, it is very important that the wiring line 170, the buffer layer 111, and the passivation layer 116 disposed in the bending area BA illustrated in FIG. 2A are not subject to the tensile force or even though the tensile force is applied, the neutral plane NP is optimized to reduce the magnitude of such force.

Hereinafter, the above-described theory of the compressive force and the tensile force is applied to the organic light emitting display device 100 illustrated in FIG. 2A.

Figure 2B:
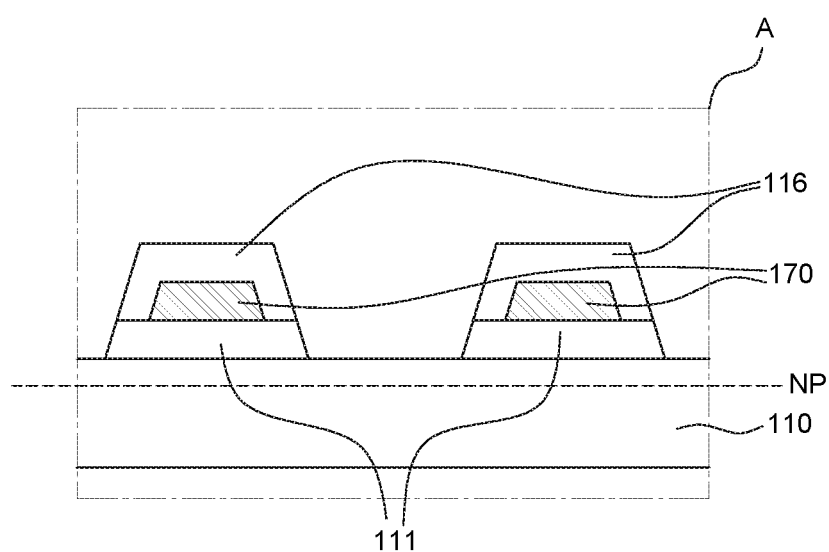
FIG. 2B is an enlarged view of a region A of FIG. 2A.

FIG. 2B is an enlarged view of a region A of FIG. 2A.

As illustrated in FIG. 2B, in the bending area BA, the buffer layer 111 is disposed on the substrate 110, the wiring line 170 is disposed on the buffer layer 111, and the passivation layer 116 is disposed to enclose the wiring line 170. The neutral plane NP is determined in consideration of thicknesses, Young's Modulus, and the materials of components disposed in the corresponding areas. In the organic light emitting display device as illustrated in FIG. 2B, the neutral plane NP is disposed on the substrate 110. Therefore, when the substrate 110 is downwardly bent, the buffer layer 111, the wiring line 170, and the passivation layer 116 disposed on the substrate 110 are all subject to the tensile force so that the wiring line 170 is directly cracked. Alternatively, if any one of the buffer layer 111 and the passivation layer 116 contains cracks or damage, such may be propagated to the wiring line 170 so that the wiring line 170 may also be cracked or damaged. Therefore, it is necessary to design the organic light emitting display device 100 such that the buffer layer 111, the wiring line 170, and the passivation layer 116 are disposed below the neutral plane NP.

Figure 4A:
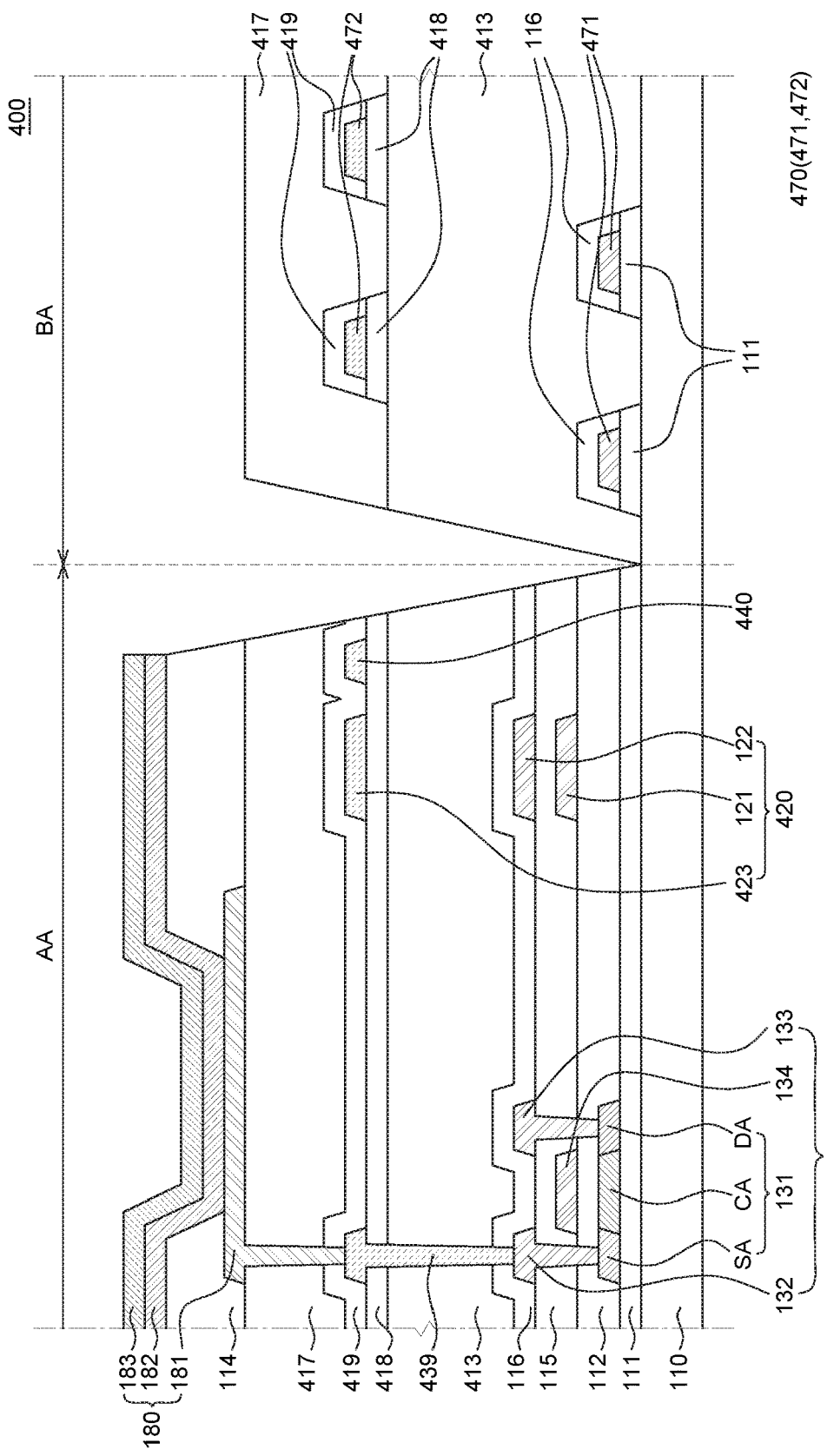
FIG. 4A is a schematic cross-sectional view for explaining an organic light emitting display device according to another embodiment of the present disclosure.

FIG. 4A is a schematic cross-sectional view for explaining an organic light emitting display device according to another embodiment of the present disclosure. As compared with the organic light emitting display device 200 illustrated in FIG. 2A, in an organic light emitting display device 400 illustrated in FIG. 4A, planarization layers 413 and 417 are changed to have a double layered structure. Therefore, except for a change in the connection relationship between the anode 181 and the source electrode 132 of the thin film transistor 130, and some changes in the storage capacitor 420, in an arrangement relationship of the wiring line 470 and in the insulating layers in the bending area BA, the organic light emitting display device 200 illustrated in FIG. 2A and the organic light emitting display device 400 illustrated in FIG. 4A are substantially the same. Therefore, redundant descriptions will be omitted.

A first planarization layer 413 is disposed on the passivation layer 116. Since the first planarization layer 413 is substantially the same as the planarization layer 113 illustrated in FIG. 2A, redundant description will be omitted.

An additional buffer layer 418 is disposed on the first planarization layer 413. The additional buffer layer 418 is an insulating layer for protecting various conductive elements formed on the buffer layer 418, for example, an intermediate electrode 439, a third electrode of the storage capacitor 420, an additional wiring line 440, and a second wiring line 472 disposed in the bending area BA which will be described below. The additional buffer layer 418 may be formed of a single layer of silicon nitride SiNx or silicon oxide SiOx which is an inorganic material or a multiple layer of silicon nitride SiNx and silicon oxide SiOx. However, the additional buffer layer 418 may be omitted depending on a design of the organic light emitting display device 400.

The intermediate electrode 439 is disposed on the additional buffer layer 418. The intermediate electrode 439 is connected to the source electrode 132 of the thin film transistor 130 through contact holes of the passivation layer 116 and the first planarization layer 413. The intermediate electrode 439 is laminated to be connected to the source electrode 132 so that the data line is also formed to have a double layered structure. That is, the data line may be formed to have a structure in which a lower layer formed of the same material as the source electrode 132 and the drain electrode 133 and an upper layer formed of the same material as the intermediate electrode 439 are connected to each other. Therefore, the data line may be implemented to have a structure in which two lines are connected in parallel, so that a wiring resistance of the data line may be reduced.

Further, on the additional buffer layer 418, a third electrode 423 of the storage capacitor 420 which is formed simultaneously with the same material as the intermediate electrode 439 is disposed. Such the storage capacitor 420 includes the first electrode 121, the second electrode 122, and the third electrode 423. Accordingly, the storage capacitor 420 may have a structure in which a capacitor having the first electrode 121 and the second electrode 122 as both terminals and a capacitor having the second electrode 122 and the third electrode 423 as both terminals are connected in parallel. As a result, the capacitance of the storage capacitor 420 may be increased.

Further, on the additional buffer layer 418, an additional wiring line 440 which is formed simultaneously with the same material as the intermediate electrode 439 is disposed. As the additional wiring line 440 is disposed on the first planarization layer 413, the number of wiring lines 470 which transfer the signals in the active area AA may be more sufficiently secured.

An additional passivation layer 419 is disposed to cover the intermediate electrode 439, the third electrode 423 of the storage capacitor 420, and the additional wiring line 440 on the first planarization layer 413. The additional passivation layer 419 is a configuration for protecting the intermediate electrode 439, the third electrode 423 of the storage capacitor 420, and the additional wiring line 440. The additional passivation layer 419 may be configured by a single layer of silicon nitride (SiNx) or silicon oxide (SiOx) which is an inorganic material or a multiple layer of silicon nitride (SiNx) or silicon oxide (SiOx). However, the additional passivation layer 419 may be omitted depending on a design of the organic light emitting display device 400.

A second planarization layer 417 is disposed to planarize upper portions of the intermediate electrode 439, the third electrode 423 of the storage capacitor 420, and the additional wiring line 440. The second planarization layer 417 may perform the same function as the planarization layer 113 illustrated in FIG. 2A and may be formed of the same material as the planarization layer 113 illustrated in FIG. 2A. The anode 181 of the organic light emitting element 180 is connected to the intermediate electrode 439 through contact holes of the second planarization layer 417 and the additional passivation layer 419 and may be electrically connected to the source electrode 132 of the thin film transistor 130 through the intermediate electrode 439.

A first wiring line 417 is disposed on the substrate 110 in the bending area BA. Specifically, the buffer layer 111 is disposed on the substrate 110, the first wiring line 471 is disposed on the buffer layer 111, and the passivation layer 116 is disposed to enclose the first wiring line 471. The first wiring line 471 is substantially the same as the wiring line 170 illustrated in FIG. 2A, so that redundant description will be omitted.

The first planarization layer 413 is disposed on the first wiring line 471 and the second wiring line 472 is disposed on the first planarization layer 413. Specifically, an additional buffer layer 418 is disposed on the first planarization layer 413, the second wiring line 472 is disposed on the additional buffer layer 418, and an additional passivation layer 419 is disposed to enclose the second wiring line 472. The second wiring line 472 may be formed simultaneously with the same material as the intermediate electrode 439 formed in the active area AA. In this case, the second wiring line 472 may be disposed so as not to overlap the first wiring line 471. That is, the second wiring line 472 may be correspondingly disposed between two adjacent first wiring lines 471.

As described above, since the wiring lines 470 are disposed to have a double layered structure of the first wiring line 471 and the second wiring line 472, when the same number of wiring lines 470 is disposed, the area occupied by the wiring lines 470 may be reduced. Therefore, the area of the non-active area NA may be reduced and the narrow bezel may also be implemented.

Further, when the area occupied by the wiring lines 470 is equally maintained, the number of wiring lines 470 which transfer one signal may be increased. For example, the wiring lines 470 may be configured such that two first wiring lines 471 transfer one signal and two second wiring lines 472 transfer the other signal. More detailed description thereof will be provided with reference to FIG. 4B.

Figure 4B:
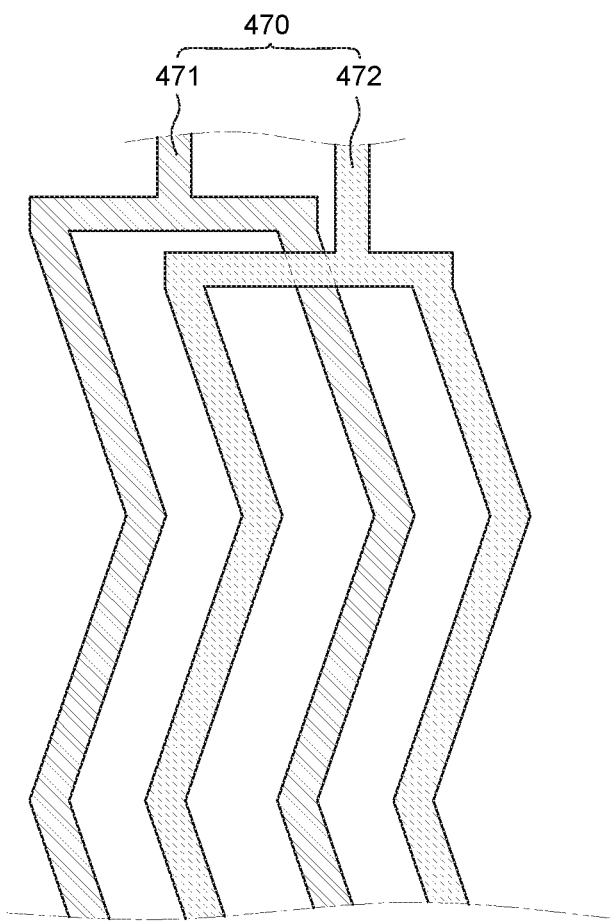
FIG. 4B is a schematic plan view for explaining a wiring line structure of an organic light emitting display device according to another embodiment of the present disclosure.

FIG. 4B is a schematic plan view for explaining a wiring line structure of an organic light emitting display device according to another embodiment of the present disclosure. In FIG. 4B, only the wiring line 470 including the first wiring line 471 and the second wiring line 472 is illustrated for the convenience of description.

As described above, as long as the area occupied by the wiring lines 470 is equally maintained, the number of wiring lines 470 which transfer the same (one) signal may be increased. For example, as illustrated in FIG. 4B, the wiring lines 470 may be configured such that two adjacent first wiring lines 471 transfer one signal and two adjacent second wiring lines 472 transfer the other signal. Further, as illustrated in FIG. 4B, the first wiring lines 471 and the second wiring lines 472 may be alternately disposed on the plane.

As described above, the first wiring line 471 and the second wiring line 472 which are located on different layers transfer different signals, so that it is desirable to maximize the interval between the first wiring line 471 and the second wiring line 472. That is, as the interval between the first wiring line 471 and the second wiring line 472 is reduced, a possibility of interference of the signals which are transferred through the first wiring line 471 and the second wiring line 472 is increased. Therefore, it is desirable to maximize the interval between the first wiring line 471 and the second wiring line 472 within a designable range. Therefore, the first wiring line 471 and the second wiring line 472 do not overlap each other and the second wiring line 472 may be disposed between adjacent first wiring lines 471, that is, may be disposed to correspond to the middle portion between adjacent first wiring lines 471.

Further, the first wiring line 471 and the second wiring line 472 may be formed to extend in a direction different from extending directions of the first wiring line 471 and the second wiring line 472, respectively. That is, as illustrated in FIG. 4B, the first wiring line 471 and the second wiring line 472 downwardly extend and the first wiring line 471 and the second wiring line 472 are actually formed in a diagonal direction. Therefore, force which is applied to the first wiring line 471 and the second wiring line 472 at the time of bending may be dispersed and the force which is applied to the buffer layer 111, the additional buffer layer 418, the passivation layer 116, and the additional passivation layer 410 enclosing the first wiring line 471 and the second wiring line 472 may also be dispersed.

Referring to FIG. 4A again, in the bending area BA, the buffer layer 111 is disposed on the substrate 110, the first wiring line 471 is disposed on the buffer layer 111, and the passivation layer 116 is disposed to enclose the first wiring line 471. Further, the first planarization layer 413 is disposed on the buffer layer 111, the wiring line 470, and the passivation layer 116 and the additional buffer layer 418, the second wiring line 472, and the additional passivation layer 419 are disposed on the first planarization layer 413. Further, the second planarization layer 417 is disposed to cover the additional buffer layer 418, the second wiring line 472, and the additional passivation layer 419 on the first planarization layer 413. The neutral plane NP is determined in consideration of thicknesses, Young's Modulus, and the materials of components disposed in the corresponding areas. In the organic light emitting display device 400 as illustrated in FIG. 4A, the neutral plane NP is disposed on the first planarization layer 413. Therefore, when the substrate 110 is downwardly bent, all the buffer layer 111, the first wiring line 471, and the passivation layer 116 disposed below the first planarization layer 413 are applied with the compressive force. In contrast, the additional buffer layer 418, the second wiring line 472, and the additional passivation layer 419 disposed above the first planarization layer 413 are all subject to the tensile force. Therefore, it is necessary to design the organic light emitting display device 400 by optimizing the neutral plane NP such that the additional buffer layer 418, the second wiring line 472, and the additional passivation layer 419 are disposed below the neutral plane NP.

Figure 5:
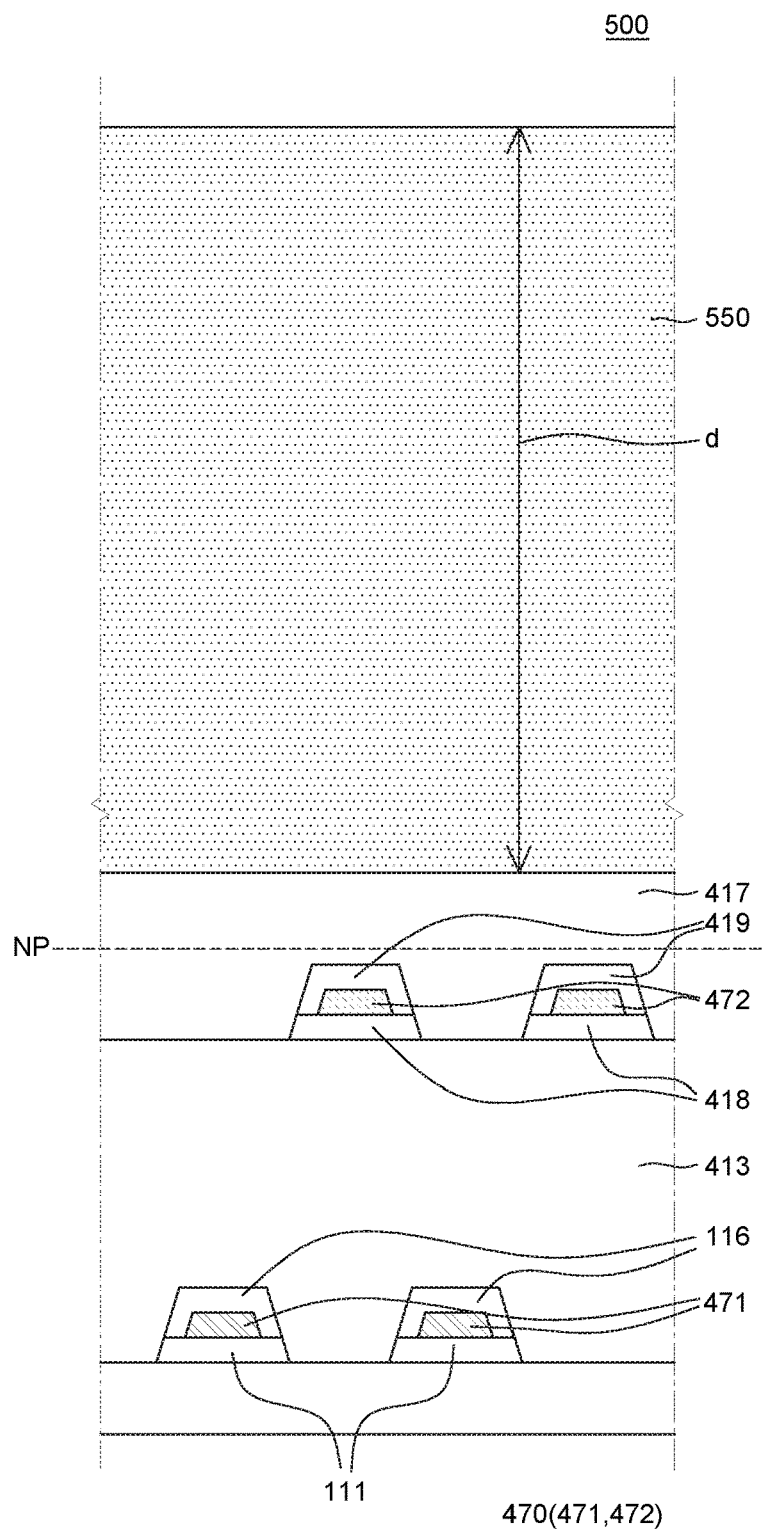
FIGS. 5 to 7 are schematic cross-sectional views for explaining an organic light emitting display device according to various embodiments of the present disclosure to which a micro cover layer is applied.
Figure 6:
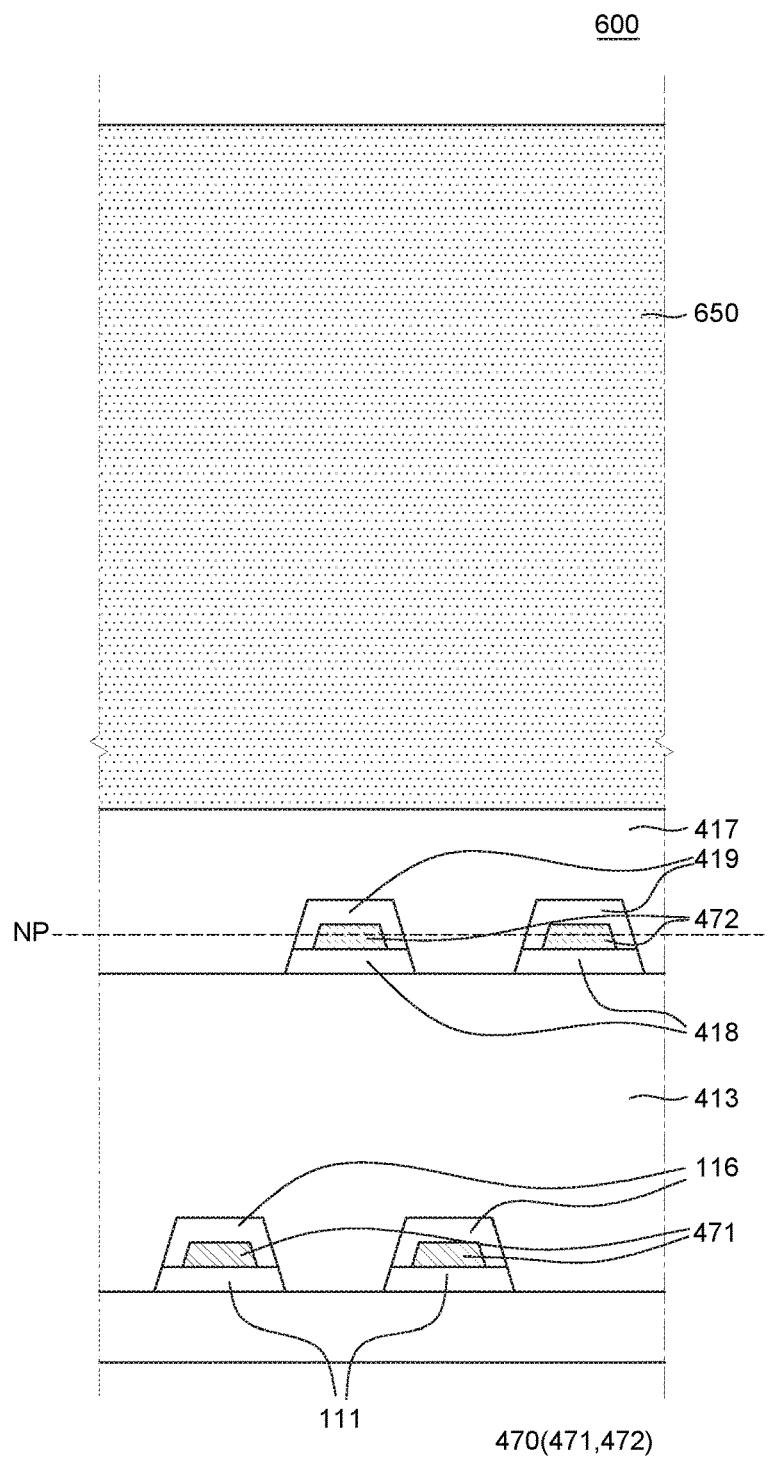
Figure 7:
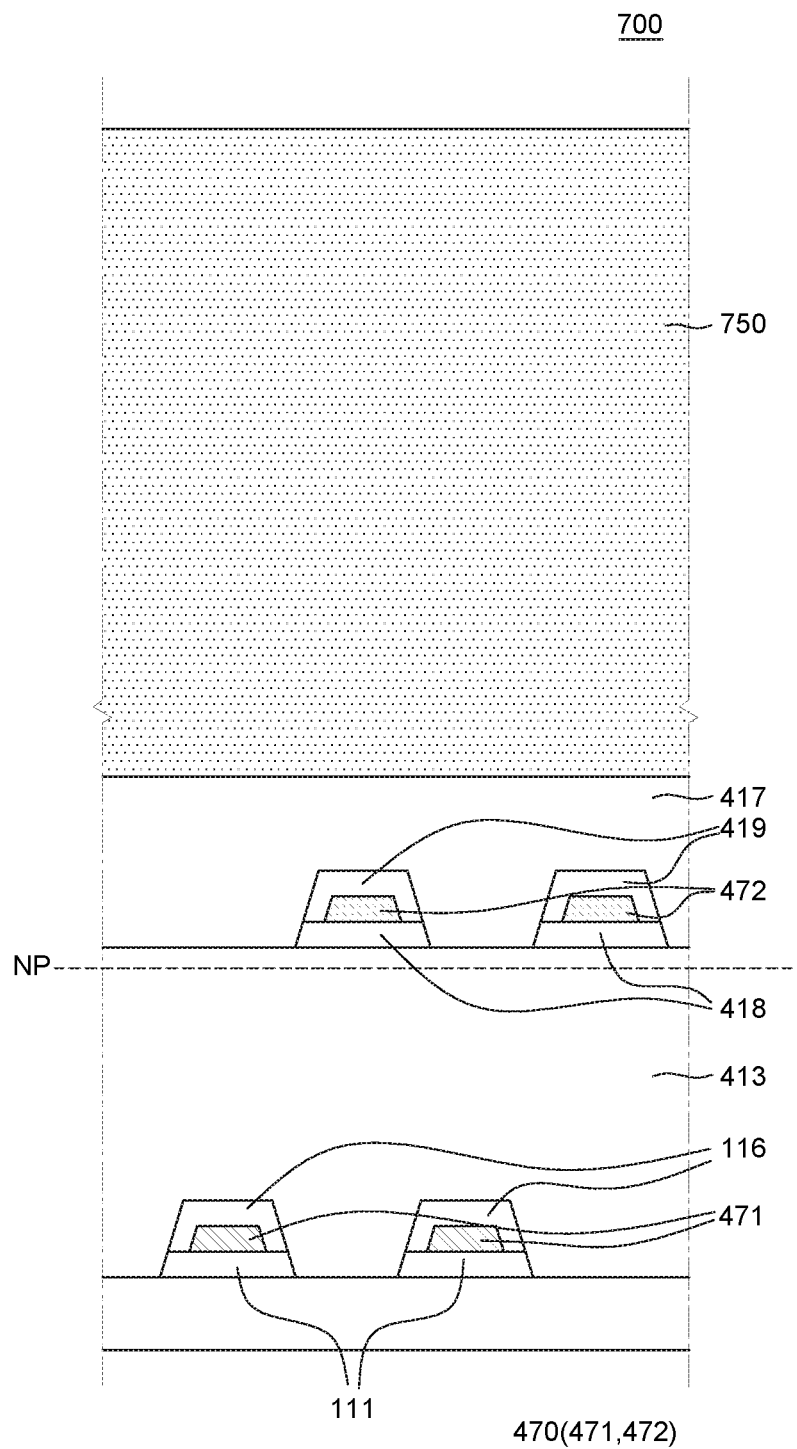

FIGS. 5 to 7 are schematic cross-sectional views for explaining an organic light emitting display device according to various embodiments of the present disclosure to which a micro-cover layer (MCL) is applied. Specifically, FIGS. 5 to 7 illustrate various embodiments which optimize the neutral plane NP in the bending area BA. Further, as compared with the organic light emitting display device 400 illustrated in FIG. 4A, organic light emitting display devices 500, 600, and 700 illustrated in FIGS. 5 to 7 further include micro-cover layers 550, 650, and 750, which is different from the organic light emitting display device 400. Therefore, redundant description will be omitted.

First, referring to FIG. 5, in order to optimize the neutral plane NP in the bending area BA of the organic light emitting display device 500, a micro-cover layer 550 is disposed on the second planarization layer 417. Components below the second planarization layer 417 are substantially the same as the components illustrated in FIG. 4A, so that redundant description will be omitted.

As described above, a specific component is more vulnerable to the crack when the tensile force between the compressive force and the tensile force having the same magnitude is applied thereto. Accordingly, as illustrated in FIG. 5, not only the first wiring line 471 and the second wiring line 472, but also the buffer layer 111, the passivation layer 116, the additional buffer layer 418, and the additional passivation layer 419 enclosing the first wiring line 471 and the second wiring line 472 are desirably disposed below the neutral plane NP. As described above, in order to adjust the neutral plane NP, the micro cover layer 550 is disposed on the second planarization layer 417 and a thickness d and a constituent material of the micro cover layer 550 are determined.

First, in order to adjust the neutral plane NP as illustrated in FIG. 5, the thickness d of the micro cover layer 550 may be determined. As the thickness d of the micro cover layer 550 disposed on the second planarization layer 417 is increased, the neutral plane NP is raised. Therefore, the thickness d of the micro-cover layer 550 may be determined to have a large value in order to adjust the neutral plane NP on the additional passivation layer 419. However, when the thickness d of the micro-cover layer 550 is too large, a problem may be generated during a system locking process of the organic light emitting display device 500. In contrast, when the thickness d of the micro-cover layer 550 is too small, the neutral plane NP may not be disposed on the additional passivation layer 419. Therefore, the thickness d of the micro-cover layer 550 may be determined in consideration of the above description. For example, the thickness d of the micro-cover layer 550 may be 70 μm to 120 μm.

Further, in order to adjust the neutral plane NP as illustrated in FIG. 5, the constituent material of the micro cover layer 550 may be determined. In order to implement the micro-cover layer 550 to have the above-described thickness, the micro-cover layer 550 may be formed of organic materials. One important factor for determining a position of the neutral plane NP is a Young's modulus of the constituent material of the micro cover layer 550. The Young's modulus is a value indicating flexibility and is a unique characteristic of a material which indicates a degree of resistance to tensile or compressive stress of the material. When a Young's modulus of a specific material is high, the resistance to the tensile or compressive stress is also large so that it is difficult to modify a shape of the material. In contrast, when the Young's modulus is low, the resistance to the tensile or compressive stress is low, so that it is easy to modify the shape of the material. When the Young's modulus of the constituent material of the micro-cover layer 550 is high, the position of the neutral plane NP may be raised. However, when the Young's modulus of the constituent material of the micro-cover layer 550 is too high, the micro cover layer 550 itself may be cracked during the bending process. In contrast, when the Young's modulus of the micro cover layer 550 is too low, the neutral plane NP may not be disposed on the additional passivation layer 419. That is, when the Young's modulus of the constituent material of the micro cover layer 550 is too low so that the neutral plane NP is disposed below the additional passivation layer 419, the second wiring line 472, and the additional buffer layer 418, the additional passivation layer 419, the second wiring line 472, and the additional buffer layer 418 are disposed on the neutral plane NP so as to be applied with a tensile force and cracked. Therefore, the constituent material of the micro cover layer 550 may be determined to have a Young's modulus such that the micro cover layer 550 is not broken as the Young's modulus is increased, by disposing the neutral plane NP on the additional passivation layer 419. The micro cover layer 550 may be formed of a material having a Young's modulus of 0.3 Gpa to 0.85 Gpa. That is, the micro cover layer 550 may be formed of a material having a relatively high Young's modulus. For example, the micro cover layer 550 may be formed of acrylic material, and may be formed of urethane acrylate.

When the neutral plane NP is disposed on the additional passivation layer 419 as illustrated in FIG. 5 by adjusting the thickness d and the constituent material of the micro cover layer 550, not only the first wiring line 471 and the second wiring line 472, but also all the buffer layer 111, the additional buffer layer 418, the passivation layer 116, and the additional passivation layer 419 which are formed of an inorganic material are disposed below the neutral plane NP. Therefore, all the first wiring line 471, the second wiring line 472, the buffer layer 111, the additional buffer layer 418, the passivation layer 116, and the additional passivation layer 419 are applied with the compressive force at the time of bending. Therefore, the crack generated in the first wiring line 471, the second wiring line 472, the buffer layer 111, the additional buffer layer 418, the passivation layer 116, and the additional passivation layer 419 may be reduced.

Next, referring to FIG. 6, the thickness and the constituent material of the micro cover layer 650 may be determined such that the neutral plane NP is disposed on one of the additional buffer layer 418, the second wiring line 472, and the additional passivation layer 419 in the organic light emitting display device 600.

As described above, a specific component is more vulnerable to the crack when the tensile force between the compressive force and the tensile force having the same magnitude is applied thereto. Therefore, as illustrated in FIG. 5, the thickness and the constituent material of the micro cover layer 650 may be determined such that all components which are vulnerable to the crack are applied with the compressive force. However, when a considerably large compressive force is applied to the buffer layer 111, the first wiring line 471, and the passivation layer 116 which are relatively spaced apart from the neutral plane NP due to the thicknesses or constituent materials of the components of the organic light emitting display device 600, the buffer layer 111, the first wiring line 471, and the passivation layer 116 may be cracked. In this case, the thickness and the constituent material of the micro cover layer 650 may be changed to lower the position of the neutral plane NP.

Further, the neutral plane NP is a plane to which the stress is not applied at the time of bending since a magnitude of the compressive force is equal to a magnitude of the tensile force. Therefore, as illustrated in FIG. 6, when the thickness and the constituent material of the micro cover layer 650 is determined such that the neutral plane NP is disposed in the second wiring line 472, no stress may be applied to the second wiring line 472. Further, when the thickness and the constituent material of the micro cover layer 650 is determined such that the neutral plane NP is disposed on the additional buffer layer 418 or the additional passivation layer 419 which are formed of inorganic materials, no stress may be applied to additional buffer layer 418 or the additional passivation layer 419.

Next, referring to FIG. 7, a thickness and a constituent material of a micro cover layer 750 may be determined such that the neutral plane NP is disposed on a first planarization layer 413 in an organic light emitting display device 700.

As described above, a specific component is more vulnerable to the crack when the tensile force between the compressive force and the tensile force having the same magnitude is applied thereto. Therefore, as illustrated in FIG. 5→FIG. 7, the thickness and the constituent material of the micro cover layer 750 may be determined such that all components which are vulnerable to the crack are applied with the compressive force. However, when a considerably large compressive force is applied to the buffer layer 111, the first wiring line 471, and the passivation layer 116 which are relatively spaced apart from the neutral plane NP due to the thicknesses or constituent materials of the components of the organic light emitting display device 700, the buffer layer 111, the first wiring line 471, and the passivation layer 116 may be cracked. In this case, the thickness and the constituent material of the micro cover layer 750 may be changed to lower the position of the neutral plane NP. Therefore, even though the neutral plane NP may be lowered as illustrated in FIG. 6, when the neutral plane NP is disposed on any one of the additional buffer layer 418, the second wiring line 472, and the additional passivation layer 419, a considerably large compressive force may be applied to the buffer layer 111, the first wiring line 471, and the passivation layer 116.

Therefore, the thickness and the constituent material of the micro cover layer 750 may be determined such that the neutral plane NP is disposed in a lower portion to be disposed on the first planarization layer 413 as illustrated in FIG. 7. However, when the neutral plane NP is disposed on the first planarization layer 413, the additional buffer layer 418, the second wiring line 472, and the additional passivation layer 419 are disposed on the neutral plane NP and are applied with a tensile force at the time of bending. Therefore, it is desirable to dispose the neutral plane NP to be close to the additional buffer layer 418, the second wiring line 472, and the additional passivation layer 419 as much as possible.

Figure 8A:
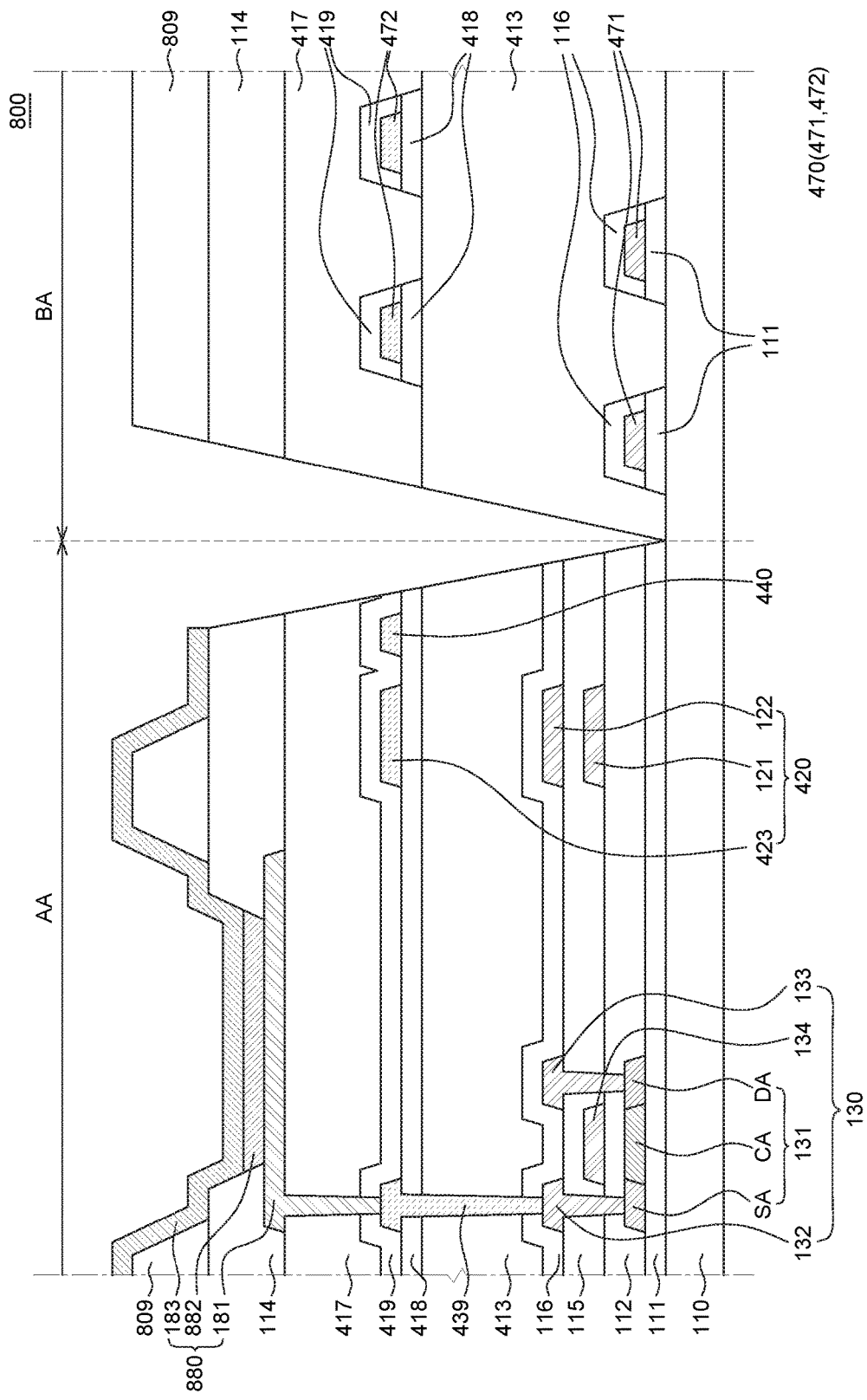
FIGS. 8A and 8B are schematic plan views for explaining an organic light emitting display device according to another embodiment of the present disclosure.

FIG. 8A is a schematic cross-sectional view for explaining an organic light emitting display device according to another embodiment of the present disclosure. Except that a spacer 809 is added, an organic light emitting element 880 is changed, and the spacer 809 and a bank 114 are additionally disposed in the bending area BA, an organic light emitting display device 800 illustrated in FIG. 8A is substantially the same as the organic light emitting display device 400 illustrated in FIG. 4A. Therefore, redundant description will be omitted. In FIG. 8A, the micro cover layer 850 disposed in the bending area BA is omitted and the micro cover layer 850 will be described in detail with reference to FIG. 8B.

A bank 114 is disposed on the anode 181 and the second planarization layer 417 in the active area AA. The bank 114 defines a pixel area by dividing adjacent pixel areas in the active area AA. Further, the bank 114 is disposed on the second planarization layer 417 in the bending area BA.

The spacer 809 is disposed on the bank 114 in the active area AA. The spacer 809 may suppress the damage of the organic light emitting element 880 which may be generated when a fine metal mask (FMM) is in direct contact with the bank 114 or the anode 181. In this case, the fine metal mask is used to form an organic light emitting layer of the organic light emitting element 880. Further, the spacer 809 is disposed on the bank 114 in the bending area BA. The spacer 809 may be formed of the same material as the bank 114 or formed of an insulating material which is different from the material of the bank 114, but is not limited thereto.

The organic layer 882 of the organic light emitting element 880 may be formed only in an area on the anode 181 which is opened (i.e. exposed) by the bank 114, rather than on the entire surface of the substrate 110. Here, the organic layer 882 emits light with a specific color and includes one of a red organic light emitting layer, a green organic light emitting layer, and a blue organic light emitting layer. As described above, the organic layer 882 may be formed such that an organic material is deposited in a state when the fine metal mask is disposed on the spacer 809. Even though in FIG. 8A, it is illustrated that the organic layer 882 includes only the organic light emitting layer, the organic layer 882 may further include various organic layers such as a hole transport layer, a hole injection layer, an electron injection layer, and an electron transport layer in addition to the organic light emitting layer. In this case, one or more layer of the hole transport layer, the hole injection layer, the electron injection layer, and the electron transport layer may be formed over the entire surface of the substrate 110.

In the organic light emitting display device 800 according to another embodiment of the present disclosure, as illustrated in FIG. 8A, as the bank 114 and the spacer 809 are disposed in the bending area BA, the neutral plane NP disposed in the bending area BA may be further raised. Therefore, the stress applied to the buffer layer 111, the first wiring line 471, the passivation layer 116, the additional buffer layer 418, the second wiring line 472, and the additional passivation layer 419 which are disposed in the bending area BA may be reduced. More detailed description thereof will be provided with reference to FIG. 8B.

Figure 8B:
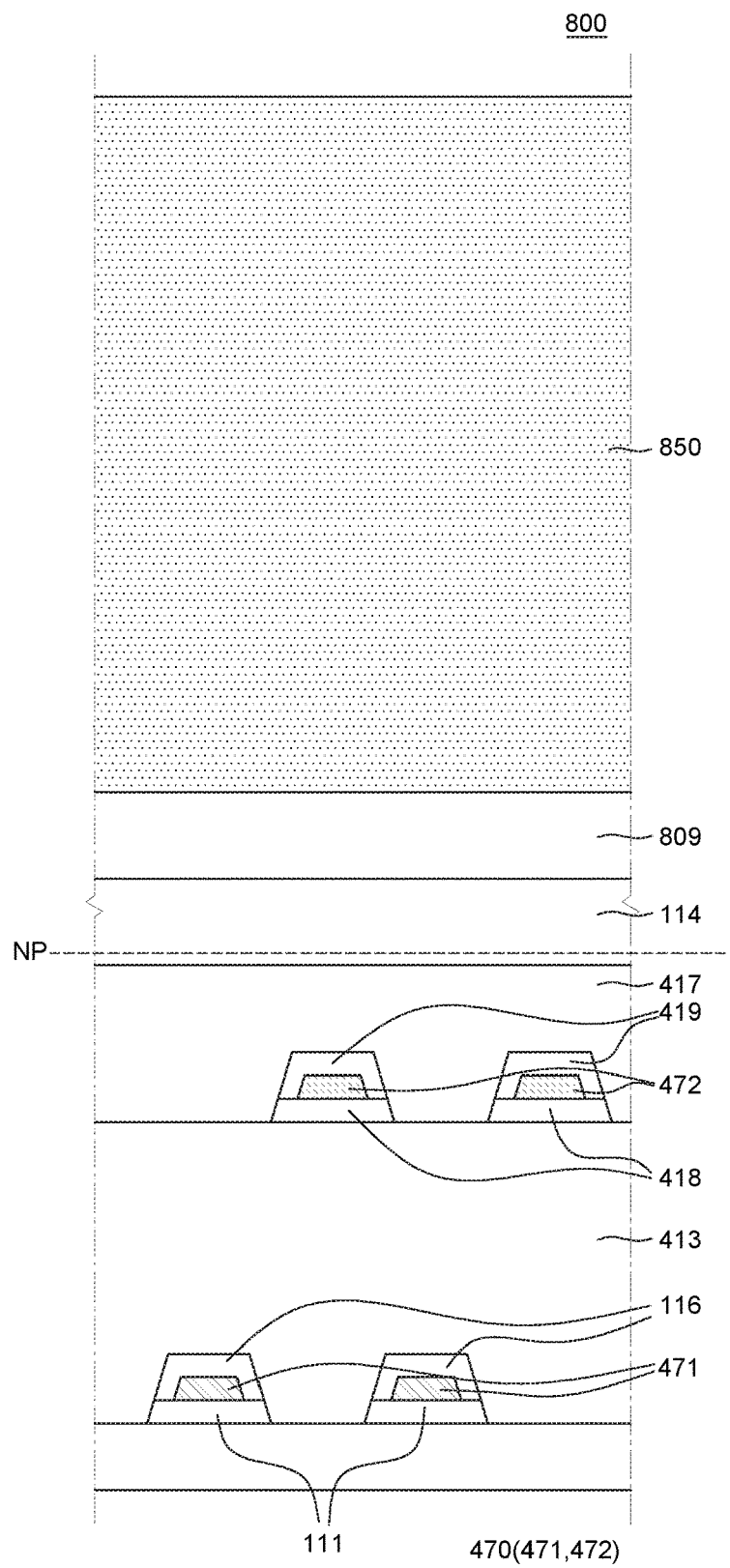

FIG. 8B is a schematic cross-sectional view for explaining an organic light emitting display device according to another embodiment of the present disclosure. In FIG. 8B, the micro cover layer 850 which is omitted in the organic light emitting display device 800 illustrated in FIG. 8A is further illustrated.

In the bending area BA, the bank 114 is disposed on the second planarization layer 417, the spacer 809 is disposed on the bank 114, and the micro cover layer 850 is disposed on the spacer 809. That is, as compared with the organic light emitting display devices 500, 600, and 700 illustrated in FIGS. 5 to 7, the bank 114 and the spacer 809 are additionally disposed between the second planarization layer 417 and the micro cover layer 850. Therefore, layers are additionally disposed on the buffer layer 111, the first wiring line 471, the passivation layer 116, the additional buffer layer 418, the second wiring line 472, and the additional passivation layer 419 so that a position of the neutral plane NP may be higher than that in the organic light emitting display devices 500, 600, and 700 illustrated in FIGS. 5 to 7.

As described above, when the tensile force between the compressive force and the tensile force having the same magnitude is applied to the buffer layer 111, the first wiring line 471, the passivation layer 116, the additional buffer layer 418, the second wiring line 472, and the additional passivation layer 419 which are disposed in the bending area BA, it is more vulnerable to cracks. Accordingly, it is important to set the position of the neutral plane NP such that the buffer layer 111, the first wiring line 471, the passivation layer 116, the additional buffer layer 418, the second wiring line 472, and the additional passivation layer 419 which are disposed in the bending area BA are disposed in an area where the compressive force is fully applied thereto. Therefore, in the organic light emitting display device 800 according to another embodiment of the present disclosure, the bank 114 and the spacer disposed in the active area AA is also disposed in the bending area BA so that the neutral plane NP is raised without performing additional deposition and etching processes. Therefore, the tensile force which is applied to the buffer layer 111, the first wiring line 471, the passivation layer 116, the additional buffer layer 418, the second wiring line 472, and the additional passivation layer 419 due to the bending may be reduced.

Even though in FIGS. 8A and 8B, it is described that the bank 114 and the spacer 809 are separate components, the bank 114 and the spacer 809 may be integrally formed. That is, in the active area AA, the bank 114 may be formed to have protrusion in the upward direction. In this case, the upwardly protruding protrusion may have the same shape as the spacer 809, but is not limited thereto.

Even though, in FIGS. 8A and 8B, it is illustrated that both the bank 114 and the spacer 809 are disposed in the bending area BA, only one of the bank 114 and the spacer 809 may be disposed between the second planarization layer 417 and the micro-cover layer 850 in the bending area.

Figure 9:
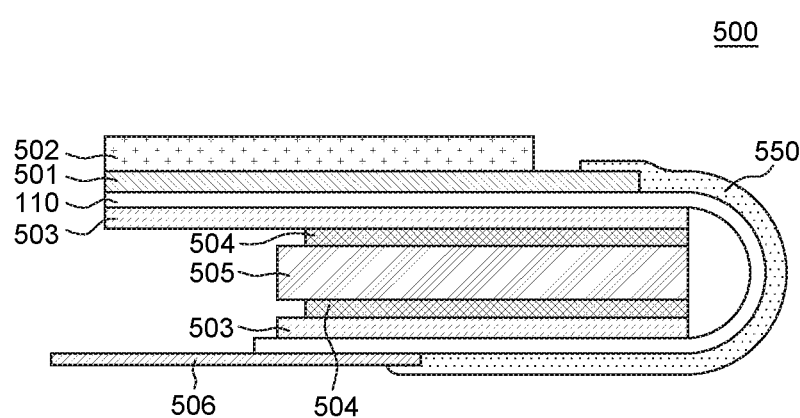
FIG. 9 is a schematic cross-sectional view illustrating a structure of the organic light emitting display device illustrated in FIG. 5 in a final bending state.

FIG. 9 is a schematic cross-sectional view for explaining a structure of the organic light emitting display device illustrated in FIG. 5 in a final bending state. In FIG. 9, a final bending structure of the organic light emitting display device 500 illustrated in FIG. 5 is illustrated. In FIG. 9, for the convenience of description, only the micro-cover layer 550 is illustrated among various components disposed on the substrate 110.

A barrier film 501 is disposed on the substrate 110. The barrier film 501 is a component for protecting various components of the organic light emitting display device 500 and is disposed so as to correspond to at least an active area AA of the organic light emitting display device 500. The barrier film 501 is configured by a material having adhesiveness and may fix a polarizer 502 on the barrier film 501. The micro-cover layer 550 may be formed to cover one side of the barrier film 501.

A back plate 503 is disposed below the substrate 110. As described above, when the substrate 110 is formed of a plastic material such as polyimide PI, a process of manufacturing the organic light emitting display device 500 is performed in a situation in which a supporting material formed of glass is disposed below the substrate 110 and the supporting substrate may be released after completing the manufacturing process of the organic light emitting display device 500. However, after the supporting substrate is released, a component for supporting the substrate 110 is still necessary. Therefore, the back plate 503 for supporting the substrate 110 may be disposed below the substrate 110. The back plate 503 may be disposed so as to be adjacent to the bending area BA in other area of the substrate 110 than the bending area BA. The back plate 503 may be formed of a plastic thin film formed of polyimide (PI), polyethylene naphthalate (PEN), polyethylene terephthalate (PET), other suitable polymers, or a combination thereof.

A supporting member 505 is disposed between two back plates 503 and the supporting member 505 may be bonded to the back plate 503 by an adhesive layer 504. The supporting member 505 may be formed of a plastic material such as polycarbonate (PC), polyimide (PI), polyethylene naphthalate (PEN), polyethylene terephthalate (PET), other suitable polymers, or a combination thereof. A strength of the supporting member 505 formed of the plastic materials may be controlled by providing additives to increase a thickness and/or strength of the supporting member 505. The supporting member 505 may be formed to have a target color (for example, black or white). Further, the supporting member 505 may be formed of glass, ceramic, metal, or other rigid materials, or a combination of the above-mentioned materials.

As described above with reference to FIG. 1, a COF 506 may be disposed on the pad 195 disposed on one side of the substrate 110. Various IC chips may be disposed in the COF 506. Further, the micro cover layer 550 may be disposed to cover one side of the COF 506.

The embodiments of the present disclosure can also be described as follows:

According to an aspect of the present disclosure, the organic light emitting display device includes: a substrate having an active area and a bending area are defined, a thin film transistor on the substrate in the active area, a first wiring line on the substrate in the bending area, a first planarization layer which is on the thin film transistor in the active area and on the first wiring line in the bending area, a second wiring line on the first planarization layer in the bending area, a second planarization layer which is on the first planarization layer in the active area and on the first planarization layer and the second wiring line in the bending area, an organic light emitting element on the second planarization layer in the active area, and a micro cover layer on the second planarization layer in the bending area.

The micro-cover layer may be configured to reduce stress applied to the first wiring line and the second wiring line by the bending in the bending area.

The micro-cover layer may be configured to set a neutral plane on the first wiring line and the second wiring line at the time of bending the bending area.

The micro-cover layer may be configured to set a neutral plane on the second wiring line at the time of bending the bending area The micro-cover layer may be configured to set a neutral plane between the first wiring line and the second wiring line at the time of bending the bending area.

The stress applied to the first wiring line and the second wiring line may be reduced by adjusting a thickness and Young's modulus of a constituent material of the micro-cover layer.

A plurality of first wiring lines and a plurality of second wiring lines may be provided and the first wiring lines and the second wiring lines may be alternately in a plan view.

The organic light emitting display device may further include an intermediate electrode which is on the first planarization layer and electrically connects an anode of the organic light emitting element to the thin film transistor in which the intermediate electrode is formed of the same material as the second wiring line.

The organic light emitting display device may further include an additional wiring line which is on the first planarization layer and transfers a signal to the thin film transistor, in which the additional wiring line is formed of the same material as the second wiring line.

The organic light emitting display device may further include a storage capacitor including a first electrode formed of the same material as a gate electrode of the thin film transistor and a second electrode formed of the same material as a source electrode and a drain electrode of the thin film transistor.

The storage capacitor may further include a third electrode which is on the first planarization layer and is formed of the same material as the second wiring line and the storage capacitor may be configured to have a structure in which a capacitor having the first electrode and the second electrode as both terminals and a capacitor having the second electrode and the third electrode as both terminals are connected to each other in parallel.

The first wiring line may be formed of the same material as a gate electrode or a source electrode and a drain electrode of the thin film transistor.

A buffer layer which is formed of an inorganic material may be below the first wiring line and the second wiring line, a passivation layer which is formed of an inorganic material may be above and a side of the first wiring line and the second wiring line, and the first wiring line and the second wiring line may be enclosed by the buffer layer and the passivation layer, respectively.

The organic light emitting display device may further include a bank on the second planarization layer in the active area; and a spacer on the bank in the active area, in which at least one of the bank and the spacer is disposed on the second planarization layer in the bending area.

The organic light emitting display device may further include a bank on the second planarization layer in the active area and the bending area, in which the bank in the active area includes an upwardly protruding protrusion.

The organic light emitting element may include one of a red organic light emitting layer, a green organic light emitting layer, and a blue organic light emitting layer.

Although the embodiments of the present disclosure have been described in detail with reference to the accompanying drawings, the present disclosure is not limited thereto and may be embodied in many different forms without departing from the technical idea of the present disclosure. Therefore, the embodiments of the present disclosure are provided for illustrative purposes only but not intended to limit the technical spirit of the present disclosure. The scope of the technical spirit of the present disclosure is not limited thereto. The protective scope of the present disclosure should be construed based on the following claims, and all the technical idea in the equivalent scope thereof should be construed as falling within the scope of the present disclosure.

What is claimed is:

1. An organic light emitting display device, comprising:
   a substrate having an active area and a bending area;
   a thin film transistor on the substrate in the active area;
   a first wiring line on the substrate in the bending area;
   a first planarization layer which is on the thin film transistor in the active area and on the first wiring line in the bending area;
   a second wiring line on the first planarization layer in the bending area;
   a second planarization layer which is on the first planarization layer in the active area and on the first planarization layer and the second wiring line in the bending area;
   an organic light emitting element on the second planarization layer in the active area; and
   a micro cover layer on the second planarization layer in the bending area.

2. The organic light emitting display device according to claim 1, wherein the micro cover layer is configured to reduce stress applied to the first wiring line and the second wiring line by the bending in the bending area.

3. The organic light emitting display device according to claim 1, wherein the micro cover layer is configured to set a neutral plane on the first wiring line and the second wiring line at the time of bending the bending area.

4. The organic light emitting display device according to claim 1, wherein the micro cover layer is configured to set a neutral plane on the second wiring line at the time of bending the bending area.

5. The organic light emitting display device according to claim 1, wherein the micro cover layer is configured to set a neutral plane between the first wiring line and the second wiring line at the time of bending the bending area.

6. The organic light emitting display device according to claim 2, wherein the stress applied to the first wiring line and the second wiring line is reduced by adjusting a thickness and Young's modulus of a constituent material of the micro cover layer.

7. The organic light emitting display device according to claim 1, wherein a plurality of first wiring lines and a plurality of second wiring lines are provided, and
the first wiring lines and the second wiring lines are alternately in a plan view.

8. The organic light emitting display device according to claim 1, further comprising:
an intermediate electrode which is on the first planarization layer and electrically connects an anode of the organic light emitting element to the thin film transistor and
wherein the intermediate electrode is formed of the same material as the second wiring line.

9. The organic light emitting display device according to claim 1, further comprising:
an additional wiring line which is on the first planarization layer and transfers a signal to the thin film transistor,
wherein the additional wiring line is formed of the same material as the second wiring line.

10. The organic light emitting display device according to claim 1, further comprising:
a storage capacitor including a first electrode formed of the same material as a gate electrode of the thin film transistor and a second electrode formed of the same material as a source electrode and a drain electrode of the thin film transistor.

11. The organic light emitting display device according to claim 10, wherein the storage capacitor further includes a third electrode which is on the first planarization layer and is formed of the same material as the second wiring line and the storage capacitor is configured to have a structure in which a capacitor having the first electrode and the second electrode as both terminals and a capacitor having the second electrode and the third electrode as both terminals are connected to each other in parallel.

12. The organic light emitting display device according to claim 1, wherein the first wiring line is formed of the same material as a gate electrode or a source electrode and a drain electrode of the thin film transistor.

13. The organic light emitting display device according to claim 1, wherein a buffer layer which is formed of an inorganic material is below the first wiring line and the second wiring line, a passivation layer which is formed of an inorganic material is above and a side of the first wiring line and the second wiring line, and the first wiring line and the second wiring line are enclosed by the buffer layer and the passivation layer, respectively.

14. The organic light emitting display device according to claim 1, further comprising:
a bank on the second planarization layer in the active area; and
a spacer on the bank in the active area,
wherein at least one of the bank and the spacer is on the second planarization layer in the bending area.

15. The organic light emitting display device according to claim 1, further comprising:
a bank on the second planarization layer in the active area and the bending area,
wherein the bank in the active area includes an upwardly protruding protrusion.

16. The organic light emitting display device according to claim 14, wherein the organic light emitting element includes one of a red organic light emitting layer, a green organic light emitting layer, and a blue organic light emitting layer.

* * * * *